United States Patent
Suzuki et al.

(10) Patent No.: US 6,794,675 B1
(45) Date of Patent: Sep. 21, 2004

(54) ORGANIC ELECTROLUMINESCENCE DISPLAY WITH IMPROVED CONTACT CHARACTERISTICS

(75) Inventors: Koji Suzuki, Aichi (JP); Tsutomu Yamada, Gifu (JP); Nobuhiko Oda, Hashima (JP); Toshifumi Yamaji, Aichi (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/532,283

(22) Filed: Mar. 23, 2000

(30) Foreign Application Priority Data

Mar. 23, 1999 (JP) .......................................... 11-078372

(51) Int. Cl.[7] .............................................. H01L 35/24
(52) U.S. Cl. .......................... 257/40; 257/501; 257/506
(58) Field of Search ............................. 257/499–508, 257/40, 7; 313/504–509; 438/7

(56) References Cited

U.S. PATENT DOCUMENTS

| | | | | |
|---|---|---|---|---|
| 5,640,067 A | * | 6/1997 | Yamauchi et al. | 313/504 |
| 5,792,673 A | * | 8/1998 | Nagura | 438/7 |
| 6,115,007 A | * | 9/2000 | Yamazaki | 345/7 |
| 6,141,066 A | * | 10/2000 | Matsushima | 349/38 |

FOREIGN PATENT DOCUMENTS

| | | |
|---|---|---|
| JP | 5-257164 | 10/1993 |
| JP | 5-259110 | 10/1993 |
| JP | 6-118446 | 4/1994 |
| JP | 6-160905 | 6/1994 |
| JP | 08194451 | * 6/1997 |
| JP | 10-214043 | 8/1998 |

OTHER PUBLICATIONS

Merriam–Webster's Collegiate Dictionary, Merriam–Webster Inc., 10th edition, p. 653.*

Notice of grounds for rejection for patent application Ser. No. HEI 11–078372.

* cited by examiner

Primary Examiner—Nathan J. Flynn
Assistant Examiner—Leonardo Andújar
(74) Attorney, Agent, or Firm—Cantor Colburn LLP

(57) ABSTRACT

In an organic electroluminescence (EL) display, a TFT (40) and an organic EL element (60) are formed on an insulating substrate (10) such as a glass substrate. The contact portion between the first electrode region (e.g. the source 43s) of the active layer (43) of the TFT (40) and the organic EL element (60) is formed of a laminated structure. The laminated structure is formed of the structure stacked in layers with p-si forming the source (43s), a refractory metal (Mo), aluminum, a refractory metal (Mo), and ITO forming the anode 61. The reliable contact between the source 43s and the anode 61 can prevent variations in brightness and early degradation in characteristic of the TFT 40 and the organic EL element 60.

23 Claims, 4 Drawing Sheets

ORGANIC ELECTROLUMINESCENCE DISPLAY WITH IMPROVED CONTACT CHARACTERISTICS

BACKGROUND OF THE INVENTION

1. Field of the Invention

The present invention relates to an organic electroluminescence (EL) display DEVICE which has organic EL elements and thin film transistors (hereinafter referred to as TFTs) acting as switching elements.

2. Description of Related Art

FIG. 1 is a plan view illustrating the display pixel section of a conventional electroluminescence display. FIG. 2A is a cross sectional view illustrating the EL display taken along the line A—A of the FIG. 1. FIG. 2B is a cross sectional view illustrating the EL display taken along the line B—B of FIG. 1.

Referring to FIG. 1, the area, surrounded by gate signal lines 51 and drain signal lines 52, defines a display pixel. A first thin film transistor 30 is formed adjacent to the intersection of the signal lines. A capacitor is formed between the source 13s of the thin film transistor 30 and a storage capacitor electrode line 54. The source 13s of the thin film transistor 30 acts as a capacitor electrode 55 and is connected to the gate 41 of a second thin film transistor 40. The second thin film transistor 40 has the source 43s connected to the anode 61 of an organic EL element 60 and the drain 63d connected to a power source line 53 for driving the organic EL element.

The storage capacitor electrode line 54 is disposed in parallel to the gate signal line near the thin film transistor. The storage capacitor electrode line 54 is formed of, for instance, chromium. A capacitor is formed between the storage capacitor electrode line 54 and the capacitor electrode 55 connected to the source 13s of the thin film transistor, sandwiching the gate insulating film 12, to accumulate charges. This storage capacitor holds the voltage applied to the gate 41 of the second thin film transistor 40.

In order to fabricate an organic EL display, display pixels, which each include the organic EL element 60 and the thin film transistors 30 and 40, are arranged in a matrix form on the substrate 10.

Referring to FIGS. 2A and 2B, an organic EL display is fabricated by forming, in order, thin film transistors and organic EL elements on a glass or resin substrate 10 or a conductive or on a semiconductor substrate 10. When the conductive or semiconductor substrate is used as the substrate 10, an insulating film of $Sio_2$ or SiN is formed on the substrate 10. Then, the thin film transistors 30 and 40 and the organic EL display element 60 are formed over the insulating film.

First, the first thin film transistor 30 being a switching thin film transistor will be explained below.

Referring to FIG. 2A, the gate signal line 51 acting as the gate electrode 11 is formed of a high melting point metal (refractory metal) of chromium (Cr), molybdenum (Mo), or the like deposited on an insulating substrate 10 of quartz glass, non-alkali glass, or the like. The drain signal line 52 is formed of aluminum (Al) on the insulating substrate. The power source line 53, which acts as a drive power source for the organic EL element and is formed of aluminum, is disposed over the insulating substrate 10.

A gate insulating film 12 and an active layer 13 of a poly-crystalline silicon (hereinafter referred to as p-Si) film are formed in order. The so-called LDD (Lightly Doped Drain) structure is formed in the active layer 13. The source 13s and the drain 13d are disposed outside the LDD regions.

An inter-layered insulating film 15 is formed all over the surface of the gate insulating film 12, the active layer 13, and the stopper insulating film 14. The inter-layered insulating film 15 is formed by depositing a $Sio_2$ film, a SiN film, and a $Sio_2$ film, sequentially. In order to form the drain electrode 16, the contact hole formed toward the drain 13d is filled with a metal such as aluminum. Moreover, a planarization insulating film 17 of organic resin is formed all over the surface to provide a flat surface.

Next, the second thin film transistor 60 being a drive thin film transistor for the organic EL element 60 will be explained below.

Referring to FIG. 2B, a gate electrode 41 of a refractory metal such as Cr or Mo is formed on the insulating substrate 10 of quartz glass or non-alkali glass.

The gate insulating film 12 and the active layer 43 formed of a p-Si film are deposited one after another.

In the active layer 43, an intrinsic or a substantially intrinsic channel 43c is formed above the gate electrode 41. Ions are doped into the sides of the channel 43c to form the source 43s and the drain 43d.

A $SiO_2$ film, a SiN film, and a $SiO_2$ film are deposited in order all over the gate insulating film 12 and the active layer 43 to form an inter-layered insulating film 15. The contact hole formed toward the drain 43d is filled with a metal such as aluminum. Thus, a power source line 53 connected to the power source 50 is formed, a planarization insulating film 17 of organic resin is formed to flatten the whole surface. A contact hole is formed through the planarization insulating film 17 and the inter-layered insulating film 15 at the position corresponding to the source 43s. A transparent electrode, that is, the anode 61 of the organic EL element, is formed on the planarization insulating film 17. The transparent electrode is formed of an ITO ($In_2O_3$—$SnO_2$ or Indium Tin Oxide) being in contact with the source 13s via the contact hole.

The organic EL element 60 has the laminated structure, which is formed by sequentially depositing an anode 61, an emissive element layer 62, and a cathode 63. The anode 61 is formed of an ITO transparent electrode. The emissive layer 62 is formed of a first hole transport layer, a second hole transport layer, an emissive layer, and an electron transport layer. The cathode 63 is formed of a magnesium indium alloy. The cathode 63 is formed on the whole surface (that is, corresponding to the whole surface of the paper) of the substrate 10 forming an organic EL display, shown in FIG. 3.

In the organic EL element, holes injected from the anode and electrons injected from the cathode are recombined inside the emissive layer. Thus, the recombination acts to excite the organic molecules included in the emissive layer to create excitons. The emissive layer emanates light when the excitons lose radiant energy. The resultant light emanates to the outside via the anode and the transparent insulating substrate.

In order to prevent a short circuit between the cathode 63 and the anode 61 caused by breakage of the emissive layer because of a step difference in thickness of the anode, the insulating film 64 (except the area surrounded by the dotted lines) is formed on the fringes of the anode 61 after formation of the anode 61. Thereafter, the emissive element layer 62 and the cathode 63 are formed. The emissive element layer 62 radiates light via the insulating substrate 10.

The organic EL element 60, as described above, is an element of the type emanating light by supplying current from the power source line 53 to the organic EL element according to the voltage applied to the gate 41 of the second thin film transistor 30. This element is a current control driven element because of the charge injection type radiation where holes injected from the anode and electrons injected from the cathode recombine inside the emissive layer to radiate light from the emissive layer. For that reason, a current density of 1 mA/cm$^2$ is required to provide, for example, a luminance of 100 cd/cm$^2$. A current density of 100 mA/cm$^2$ is required to provide, for example, a luminance of 10000 cd/cm$^2$.

Such an organic EL element requires a large current for driving. Hence, for the purpose of good displaying, the source 13s, being of a semiconductor film, and the ITO must be in reliable electric contact.

However, in the direct contact region between the source 13s, being of the p-Si film, and the ITO, a Sio$_2$ film (an insulating film), formed on the surface of the p-Si, makes the contact unstable. As a result, there is the disadvantage that a good display quality cannot be provided.

Even if an aluminum film, with a lower resistance than the p-Si film, is formed between the source 13s and the ITO, an Al$_2$O$_3$ film is formed on the surface of the aluminum film so that a stable contact cannot be provided.

SUMMARY OF THE INVENTION

This invention is made to overcome the above-mentioned problems. It is an object of the present invention to provide an organic electroluminescence display that can make a reliable contact between the TFT active layer and the anode and can obtain an excellent display quality.

The above object of the present invention is achieved by an organic electroluminescence device comprising an organic electroluminescence element and a thin film transistor which are formed on a substrate; the organic electroluminescence element having at least an organic emissive layer disposed between an anode and a cathode; the thin film transistor controlling a current flowing to said organic electroluminescence element; the thin film transistor having an active layer made of a semiconductor material; and a refractory metal layer connecting a source region or drain region of the thin film transistor to the anode of said organic electroluminescence element.

In another aspect of the invention, an organic electroluminescence display device comprises pixels, each of the pixels including an organic electroluminescence element and a thin film transistor, the organic electroluminescence element having an emissive layer disposed between an anode and a cathode, the thin film transistor controlling a current flowing from a power source line to the organic electroluminescence element, the thin film transistor having an active layer made of a semiconductor material; and a contact between one of a source and drain in the active layer and the anode of the organic electroluminescence element, and between the other of the source and drain in the active layer and the power source line is respectively achieved through a refractory metal layer.

In the display device of another aspect of the invention, each pixel has a switching thin film transistor, the switching thin film transistor having a gate connected to a gate line, one of a source and drain in the active layer made of a semiconductor material and connected to a data line, and the other of the source and drain connected to a gate of a thin film transistor to control a flow of current supplied from a power source line to the organic electroluminescence element; the active layer of the switching thin film transistor making contact with the data line via a refractory metal layer.

In another aspect of the present invention, a light emitting device comprises an emissive element having an emissive layer between a first electrode and a second it electrode; a thin film transistor for controlling power supplied to the emissive element, the thin film transistor having an active layer made of a semiconductor transistor; and a refractory metal layer connecting a first electrode region in the active layer to the first electrode of the emissive element.

In the display in still another aspect of the invention, the refractory metal layer is in direct contact with the active layer made of the semiconductor material.

In the device in another aspect of the invention, the refractory metal layer comprises a first refractory metal layer which is in direct contact with the active layer made of the semiconductor material; and a second refractory metal layer which is in direct contact with the anode of the organic electroluminescence element.

Moreover, in the device in another aspect of the invention, a conductive metal layer is disposed between the first refractory metal layer and the second refractory metal layer.

In the device structure, the active layer may be formed of polycrystalline silicon. The conductive metal layer may be formed of aluminum. The anode of said organic electroluminescence element may be formed of a transparent conductive material. The first refractory metal layer may be either at least one of chromium (Cr), molybdenum (Mo), tungsten (W), and titanium (Ti), or an alloy including at least one of them. The conductive metal layer may be aluminum. Moreover, the active layer may be formed of a silicon semiconductor. The anode of the organic electroluminescence element may be indium tin oxide or indium zinc oxide.

According to the invention, the reliable contact can be formed between the active layer of the thin film transistor and the anode of an element such as an organic EL element. Hence, the thin film transistor can reliably supply power to the emissive devices such as organic EL elements so that the element can emanate stably. For that reason, the display device with the above structure can display respective pixels in a stable state and without any variation in brightness.

BRIEF DESCRIPTION OF THE DRAWINGS

These and other objects, features, and advantages of thee present invention will become more apparent upon a reading of the following detailed description and drawings, in which.

DESCRIPTION OF THE EMBODIMENTS

An organic EL display according to the present invention will be explained below.

Figure 3:
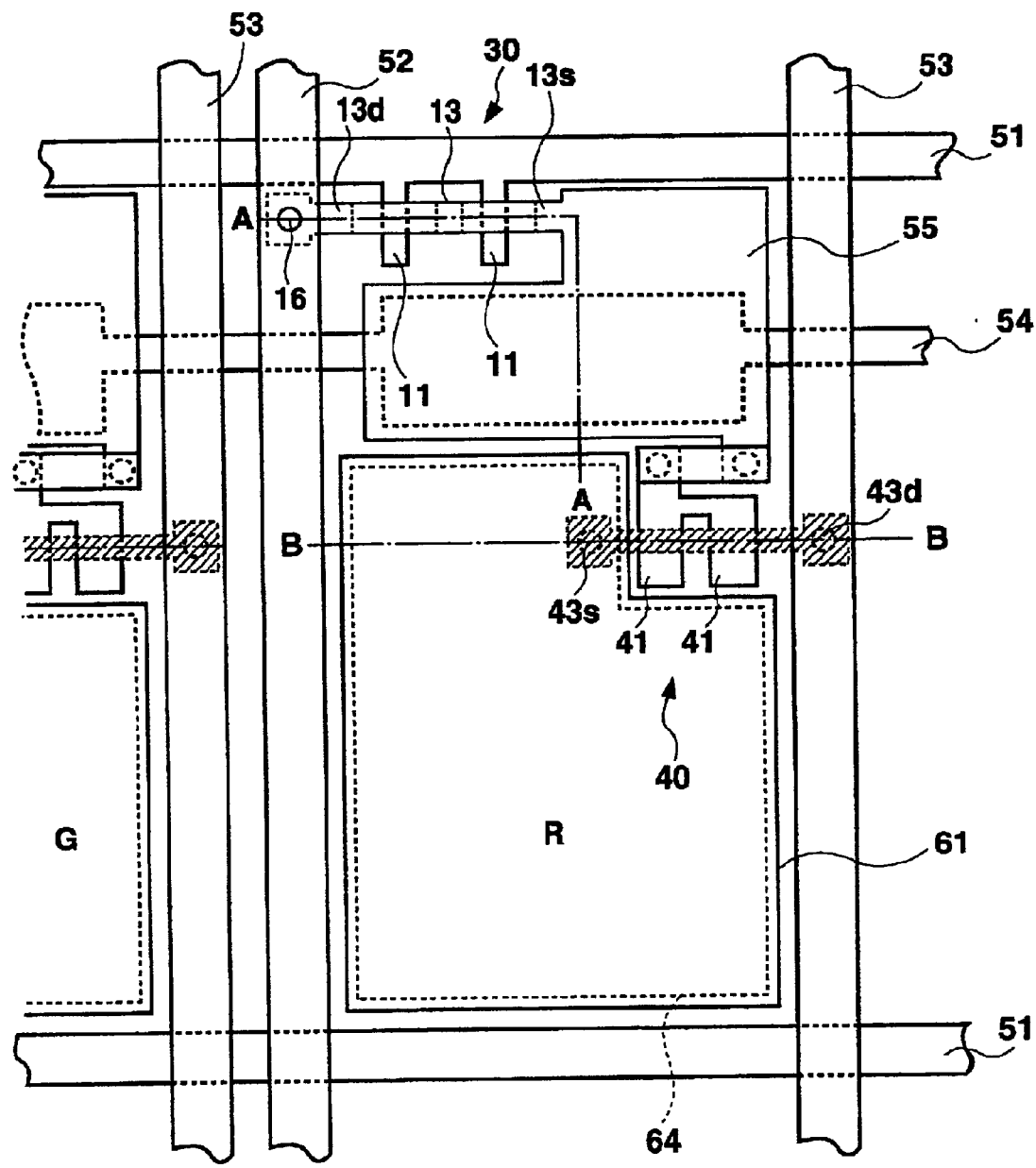
FIG. 3 is a plan view illustrating an organic EL display according to an embodiment of the present invention.
Figure 4A:
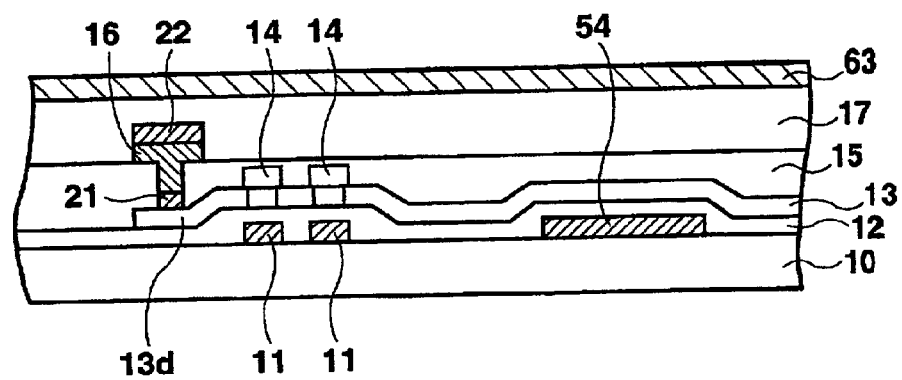
FIG. 4A is a cross-sectional view illustrating an organic EL display taken along line A—A of FIG. 3.
Figure 4B:
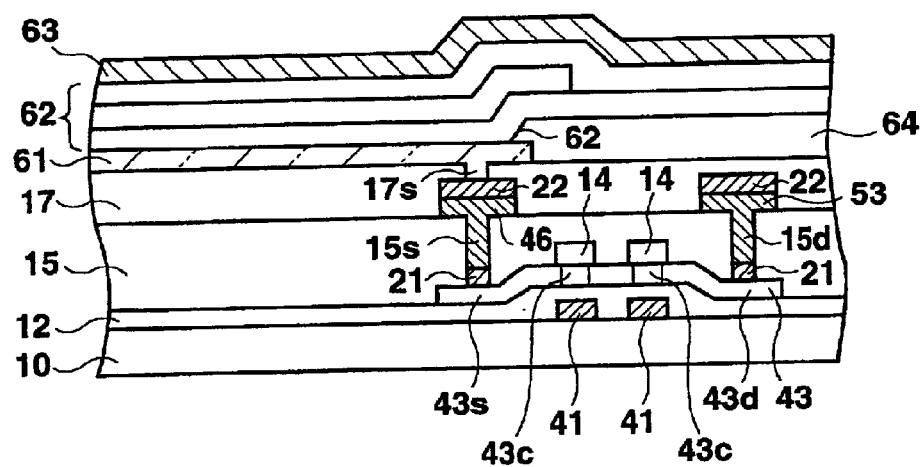
FIG. 4B is a cross-sectional view illustrating an organic EL display taken along line B—B of FIG. 3.

FIG. 3 is a plan view illustrating the display pixel portion of an organic EL display according to the present invention. FIG. 4A is a cross sectional view illustrating the configuration taken along the line A—A of FIG. 3. FIG. 4B is a cross sectional view illustrating the configuration taken along the line B—B of FIG. 3.

As shown in FIG. 3, a display pixel, having an organic EL element, is formed in the region surrounded by the gate signal lines 51 and the drain signal lines 52. A first thin film transistor 30 is disposed adjacent to the intersection of the signal lines. A capacitor is formed between a storage capacitor electrode line 54 and the source 13s (55) of the thin film transistor 30. The source 13s acts as a capacitor electrode 55 and is connected to the gate 41 of the second thin film transistor 40. The second thin film transistor 40 has the source 43s connected to the anode 61 of the organic EL element 60 and the drain 43d connected to the power source line 53 to drive the organic EL element.

The storage capacitor electrode line 54 is disposed in parallel to the gate signal line 51 near the display pixel. The storage capacitor electrode line 54 is formed of chromium and so on. A capacitor is formed by the gate insulating film 12 between the storage capacitor electrode line 54 and the capacitor electrode 55 connected to the source 13s, to accumulate charges. The storage capacitor holds the voltage to be applied to the gate 41 of the second thin film transistor 40.

Display pixels, which each include an organic EL element 60 and the thin film transistors 30 and 40, are arranged in a matrix form to form an organic EL display device.

As shown in FIGS. 4A and 4B, the organic EL display is formed by sequentially fabricating thin film transistors and organic EL elements on a glass or synthetic resin substrate 10 or on a conductive or semiconductor substrate 10. When a conductive or semiconductor substrate is used as the substrate 10, an insulating film of $SiO_2$ or SiN is first deposited on the substrate 10. Thereafter, thin film transistors and organic EL elements are formed on the insulating film.

In the present embodiment, the first thin film transistor is the so-called bottom gate-type transistor where the gate electrode 11 is formed under the active layer 13. Moreover, the second thin film transistor 40 is the so-called bottom type transistor where the gate electrode 41 is formed under the active layer 43. The case is shown where a poly-crystalline silicon (hereinafter referred to as p-Si) film is used as an active layer being a semiconductor film of thin film transistors 30 and 40. The thin film transistors have a double gate structure where the gate electrodes 11 and 41 are used but transistors, especially transistor 40, may have a single gate structure.

Figure 1:
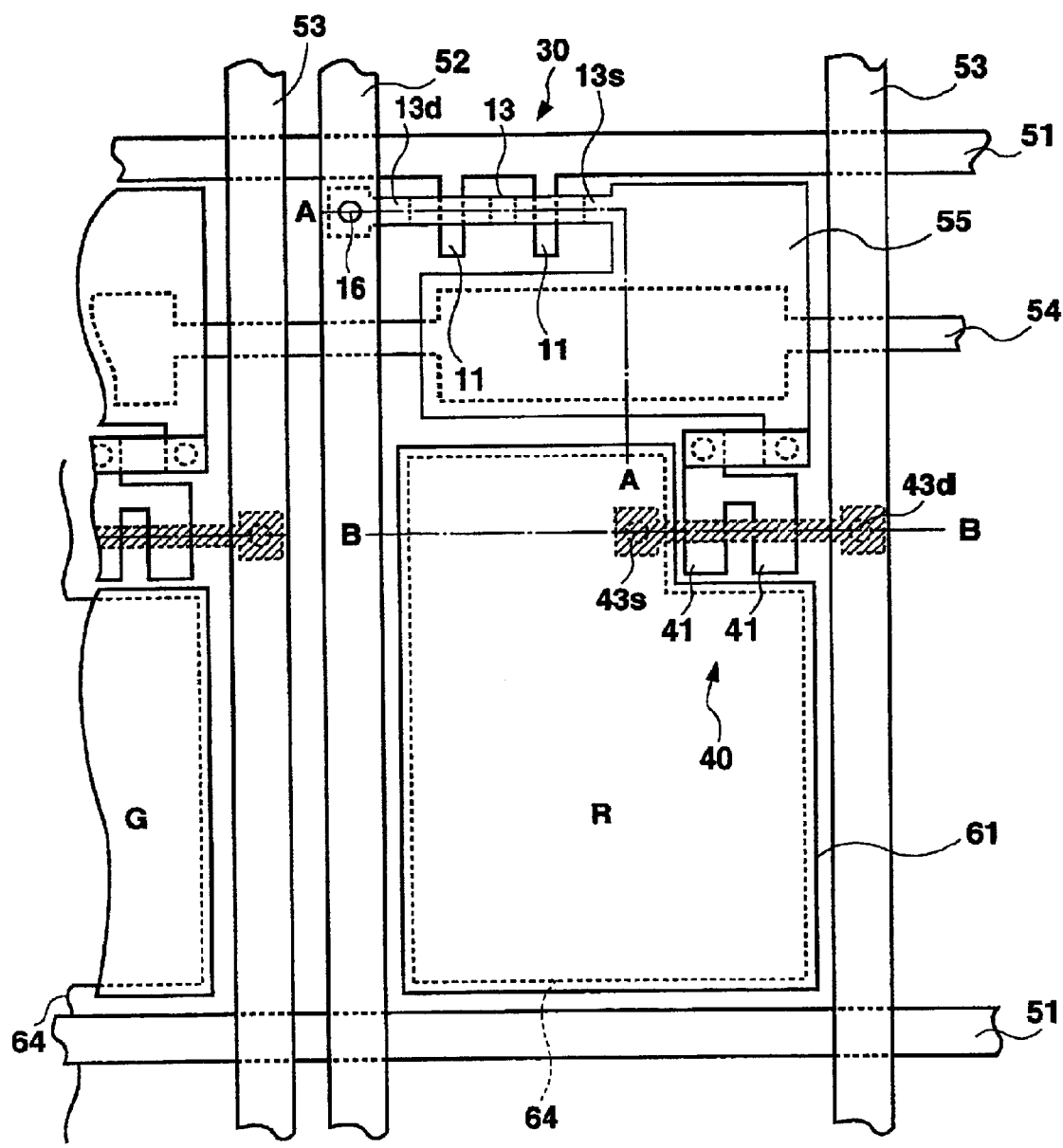
FIG. 1 is a plan view schematically illustrating an organic EL display in a related art.
Figure 2A:
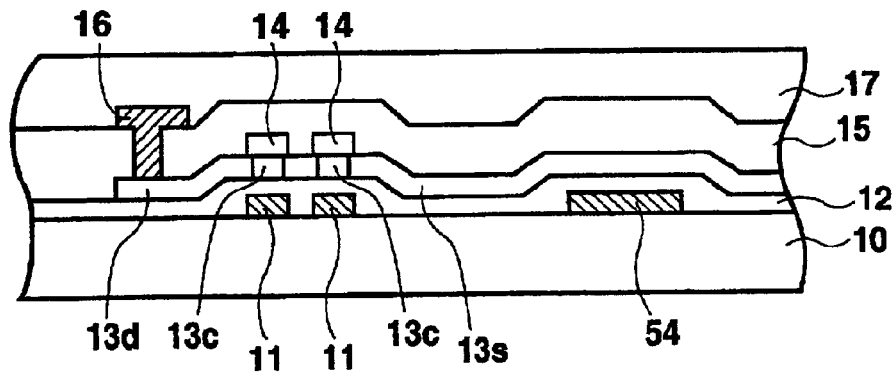
FIG. 2A is a cross-sectional view illustrating an organic EL display taken along line A—A of FIG. 1.
Figure 2B:
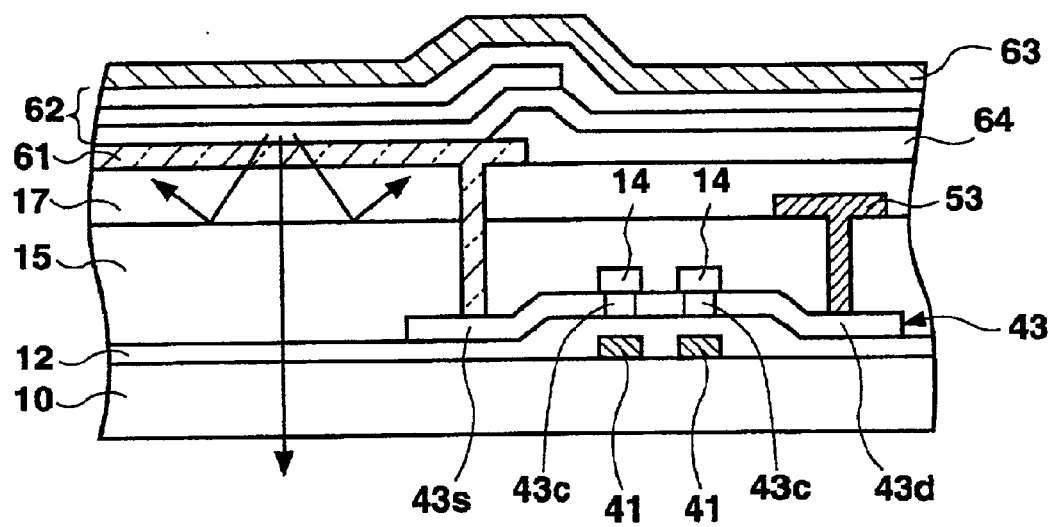
FIG. 2B is a cross-sectional view illustrating an organic EL display taken along the line B—B of FIG. 1.

The first thin film transistor 30 acting as a switching transistor can adopt the conventional structure shown in FIG. 2A. However, a refractory metal layer 21 is formed in the contact region between the drain 13d of the thin film transistor 30 and the drain signal line 52 (or the drain electrode 16), and a refractory metal film 22 is formed on the surface of the drain electrode 16, since the thin film transistor 40 and the thin film transistor 40 can be fabricated using the same process (to be described later).

Next, the second thin film transistor 40, being a drive thin film transistor for the organic EL element 60, will be explained below.

As shown in FIGS. 3 and 4B, the gate electrodes 41 of a refractory metal such as Cr or Mo are formed on the insulating substrate 10 of quartz glass or non-alkali glass. The gate insulating film 12 and the active layer 43 formed of a p-Si film are sequentially deposited in layers.

An intrinsic or substantially intrinsic channel 43c is formed in the active layer 43 and above the gate electrode 41. Ions are doped onto the sides of the channel 43c to form the source 43s and the drain 43d.

An inter-layered insulating film 15, in which a $SiO_2$ film, a SiN film, and a $SiO_2$ film are deposited in the written order, is formed on the entire surface of the gate insulating film 12 and on the entire surface of the active layer 43. A contact hole 15s is formed in the inter-layered insulating film 15 at the position corresponding to the source 43s while a contact hole 15d is formed in the inter-layered insulating film 15 at the position corresponding to the drain 43d. The first refractory metal 21, for example, molybdenum, is deposited by sputtering over the whole surface of the inter-layered film 15 and the active layer 43 exposed via each contact hole. Thereafter, aluminum (Al) being a conductive material and molybdenum (Mo) being a second refractory metal 22 are deposited in sequence by sputtering. Mo, Al and Mo are deposited on the active layer 43 exposed in the contact hole forming process. Using the photolithographic technique, a Mo and Al power source line 53 is formed in the contact hole 15d corresponding to the drain 43d and on the inter-layered film 15. A source electrode 46 is formed in the contact hole 15s corresponding to source 43s and on the inter-layered insulating film 15. A planarization insulating film 17 of an organic resin is formed on the source electrode 46, the drive power source line 53, and the inter-layered insulating film 15 to flatten the entire surface. A contact hole 17s is formed in the planarization insulating film 17 at the position corresponding to the source 43s. Thereafter, an indium tin oxide (ITO) film is deposited in the contact hole 17s and over the entire surface of the planarization insulating film 17. Using the photolithographic technique, a transparent electrode, that is, the anode 61 of the organic EL element, is formed on the planarization insulating film 17.

The organic EL element 60 is formed by sequentially depositing the anode 61, an emissive element layer 62, and the cathode 63. The anode 61 is formed of a transparent electrode of an ITO. The emissive element layer 62 is formed of a first hole transport layer, a second hole transport layer, an emissive layer, and an electron transport layer. The first hole transport layer is formed of MTDATA (4,4',4"-tris (3-methylphenylphenylamino)triphenylamine). The second hole transport layer is formed of TPD (N,N'-diphenyl-N,N'-di(3-methylphenyl)-1,1'-biphenyl-4,4'diamine). The emissive layer is formed of $Bebq_2$ containing Quinacridone derivative ($Bebq_2$:bis(10-hydroxybenzo[h]quinolinato) beryllium). The cathode 63 is formed of magnesium indium alloy. The cathode 63 is disposed over the entire surface of the substrate on which an organic EL display of FIG. 3 is formed, or on the entire surface of the paper.

In the organic EL element, holes injected from the anode and electrons injected from the cathode recombine inside the emissive layer. The recombination causes organic molecules forming the emissive layer to generate excitons. The emissive layer emanates light when the excitons lose radiant energy. The transparent anode emanates light via the transparent insulating substrate.

The insulating film 64 (outside the region shown with dotted lines) is formed on the periphery of the anode 61. The insulating film 64 is disposed to prevent a short circuit between the cathode 63 and the anode 61 because of breakage of the emissive layer caused by a step difference in thickness of the anode 61. Materials for respective layers are deposited on the anode 61 to form the emissive element layer 62. An emissive element layer 62 is formed on the anode 61 by depositing the above mentioned materials. The anode 63 being common to each organic EL element, formed of an alloy of magnesium (Mg) (opaque material) and indium (In), is formed on the emissive element layer 62 so as to cover the entire surface of the substrate 10 including the upper portion of the thin film transistor 40.

In the organic EL display of the present invention, since the resistance of the p-Si active layer in the thin film transistor is low, the drive power source can cause sufficient current to flow between the anode of the organic EL element and the source of the thin film transistor. The p-Si active layer is in direct contact with the first refractory metal layer 21 at the contact regions of the thin film transistor and the organic EL element. The refractory metal is resistant to oxidation of its surface. These features allow the ohmic contact to the p-Si layer to be reliable, so that the current can be stably supplied from the thin film transistor to the organic EL element. The anode of the organic EL element, formed of the ITO, is in direct contact with the second refractory metal layer 22. Although an oxide film is easily formed on the surface of an aluminum film, the second refractory metal layer 22 intervening between the aluminum layer and the ITO electrode can be reliably maintained in a good contact state for a long period of time.

As described above, the present invention can provide a reliable contact between the thin film transistor and the organic EL element so that the thin film transistor can stably supply the current to the organic EL element. Hence, the problem can be avoided that the organic EL element, which emanates light depending on the supplied current, varies its brightness and degrades its characteristics.

Let us now consider that the conductive material layer 46, 53, or 16 disposed between the first and second refractory metal layer 21 and 22 is formed of aluminum and that the active layer of the thin film transistor 30 or 40 is formed of p-Si. In such a case, a large current flowing in the contact region may diffuse the silicon active layer into the aluminum layer, thus deteriorating the conductive characteristics of the thin film transistor. However, according to the present invention, the first refractory metal layer 21 is disposed on the contact interface between the p-Si layer and the conductive material layer. The refractory metal layer 21 makes it difficult to be oxidized and functions as a barrier metal for blocking silicon diffused into the aluminum layer. Hence, a good contact state between the organic EL element and the thin film transistor, which supplies a large current to the organic EL element, can be maintained for a long period of time.

Moreover, like the structure of the contact portion between the organic EL element and the thin film transistor 40, the contact portion between the power source line 53 and the active layer of the thin film transistor 40, according to the present invention, has a laminated structure where an aluminum conductive material layer is disposed between the first refractory metal layer 21 and the second refractory metal layer 22. This laminated structure maintains the characteristics of the p-Si active layer and the aluminum layer and prevents the aluminum surface from being oxidized. With the laminated structure which uses the refractory metal material for the contact portion between the power source line 53 and the thin film transistor 40, the thin film transistor 40 can stably supply sufficient current to the organic EL element via the power source line 53. Moreover, in the thin film transistor 30, the contact region between the data line (drain line) 52 and the p-Si active layer of the thin film transistor 30, as shown in FIG. 4A, has the laminated structure formed of the first and second refractory metal layers and the aluminum wiring layer. This laminated structure can prevent deterioration of the thin film transistor and can reliably capture data signals to be displayed. The thin film transistors 40 and 30 are effectively formed substantially in the same fabrication process. Hence, the use of the contact region between a thin film transistor and an electrode using the same laminated structure allows the number of manufacturing steps to be minimized and the device characteristics to be improved. According to the present invention, it has been explained that the drain of the thin film transistor is connected to the signal source or the power source. However, the source of the thin film transistor may be effectively connected to the signal source or the power source.

Moreover, in the present embodiment, molybdenum (Mo) is used as the first and second refractory metals. However, the first and second refractory metals may be selected from the group consisting of chromium (Cr), molybdenum (Mo), tungsten (W), titanium (Ti), and an alloy including at least one of them. The alloy may be selected from the group consisting of MoW, TiW, and TiN (titanium nitride) alloy.

According to the present invention, oxide indium tin has been explained as the anode material. However, oxide indium zinc ($In_2O_3$—ZnO) may be used as the anode material.

A refractory metal other than the first and the second refractory metals can provide the effects of the present invention.

According to the present invention, aluminum has been explained as the conductive material. Aluminum alloy such as AlSi (aluminum silicon) alloy, AlSiCu (aluminum silicon copper alloy, AlNd (aluminum neodymium) ally may be used.

What is claimed is:

1. An organic electroluminescence device comprising:
an organic electroluminescence element and a thin film transistor which are formed on a substrate; said organic electroluminescence element having at least an organic emissive layer disposed between an anode and a cathode; said thin film transistor controlling a current flowing to said organic electroluminescence element; said thin film transistor having an active layer made of a semiconductor material;
a refractory metal layer connecting a source region or drain region of said thin film transistor to said anode of said organic electroluminescence element, said refractory metal layer, one of said source region and drain region, and said anode being laminated in a thickness direction of said substrate; and
a planarization insulating film covers said refractory metal layer,
wherein said anode is formed on said planarization insulating film, a contact hole is formed through the planarization insulating film, and said anode partially extends to said contact hole and said anode is in contact with said refractory metal layer.

2. The device defined in claim 1, wherein said refractory metal layer is in direct contact with said active layer made of said semiconductor material.

3. The device defined in claim 1, wherein said refractory metal layer comprises:
a first refractory metal layer which is in direct contact with said active layer made of said semiconductor material; and a second refractory metal layer which is in direct contact with said anode of said organic electroluminescence element.

4. The device defined in claim 1, wherein said refractory metal layer comprises:
a first refractory metal layer which is in direct contact with said active layer made of said semiconductor material;
a second refractory metal layer which is in direct contact with said anode of said organic electroluminescence element; and
a conductive metal layer disposed between said first refractory metal layer and said second refractory metal layer.

5. The device defined in claim 4, wherein said active layer comprises polycrystalline silicon; and wherein said conductive metal layer comprises aluminum; and wherein said anode of said organic electroluminescence element comprises a transparent conductive material.

6. The device defined in claim 4, wherein said first refractory metal layer contains either at least one of chromium, molybdenum, tungsten, and titanium, or an alloy including at least one of them; and wherein said conductive metal layer comprises aluminum.

7. The device defined in claim 6, wherein said active layer comprises a silicon semiconductor; and wherein said anode of said organic electroluminescence element comprises indium tin oxide or indium zinc oxide.

8. The device defined in claim 1, wherein said refractory metal layer of said source region is substantially identical in shape to said refractory metal layer of said drain region.

9. The device defined in claim 4, wherein said conductive metal layer of said source region is substantially identical in shape to said conductive metal layer of said drain region.

10. An organic electroluminescence device comprising:
pixels, each of said pixels including an organic electroluminescence element and a thin film transistor, said organic electroluminescence element having an emissive layer disposed between an anode and a cathode, said thin film transistor controlling a current flowing from a power source line to said organic electroluminescence element, said thin film transistor having an active layer made of a semiconductor material;
a contact between one of a source and drain in said active layer and said anode of said organic electroluminescence element, and between the other of said source and drain in said active layer and said power source line, said contact being achieved through a refractory metal layer, said refractory metal layer, one of said source and drain, and said anode being laminated in a thickness direction of said organic electroluminescence device; and
a planarization insulating film covers said refractory metal layer,
wherein said anode is formed on said planarization insulating film, a contact hole is formed through the planarization insulating film, and said anode partially extends to said contact hole and said anode is in contact with said refractory metal layer.

11. The display device defined in claim 10, wherein said refractory metal layer is in direct contact with said active layer made of said semiconductor material.

12. The display device defined in claim 10, wherein said refractory metal layer disposed between one of the source and drain of said active layer and said anode of said organic electroluminescence element, comprises:
a first refractory metal layer being in direct contact with said active layer of said semiconductor material;
a second refractory metal layer being in direct contact with said anode of said organic electroluminescence element; and
a conductive metal layer disposed between said first refractory metal layer and said second refractory metal layer.

13. The display device defined in claim 12, wherein said active layer comprises polycrystalline silicon; and wherein said conductive metal layer comprises aluminum; and wherein said anode of said organic electroluminescence element comprises a transparent conductive material.

14. The device defined in claim 10, wherein said refractory metal layer of said source region is substantially identical in shape to said refractory metal layer of said drain region.

15. The display device defined in claim 10, wherein each pixel has a switching thin film transistor, said switching thin film transistor having a gate connected to a gate line, one of a source and drain in said active layer made of a semiconductor material and connected to a data line, and the other of said source and drain connected to a gate of a thin film transistor to control a flow of current supplied from a power source line to said organic electroluminescence element; said active layer of said switching thin film transistor making contact with said data line via a refractory metal layer.

16. The device defined in claim 12, wherein said conductive metal layer of said source region is substantially identical in shape to said conductive metal layer of said drain region.

17. A light emitting device comprising:
an emissive element having an emissive layer between a first electrode and a second electrode;
a thin film transistor for controlling power supplied to said emissive element, said thin film transistor having an active layer made of a semiconductor material;
a refractory metal layer connecting a first electrode region in said active layer to said first electrode of said emissive element, said refractory metal layer, said first electrode region and said first electrode being laminated in a thickness direction of said light emitting device;
a planarization insulating film covers said refractory metal layer;
an anode is formed on said planarization insulating film; and
a contact hole is formed through the planarization insulating film,
wherein said anode partially extends to said contact hole and said anode is in contact with said refractory metal layer.

18. The light emitting device defined in claim 17, wherein said refractory metal layer is in direct contact with said active layer made of said semiconductor material.

19. The light emitting device defined in claim 17, wherein said refractory metal layer comprises:
a first refractory metal layer which is in direct contact with said active layer made of said semiconductor material; and
a second refractory metal layer which is in direct contact with a first electrode of said emissive element.

20. The light emitting device defined in claim 17, wherein said refractory metal layer comprises:
a first refractory metal layer which is in direct contact with said active layer made of said semiconductor material;

a second refractory metal layer which is in direct contact with said first electrode of said emissive element; and a conductive metal layer disposed between said first refractory metal layer and said second refractory metal layer.

21. The light emitting device defined in claim 20, wherein said active layer comprises polycrystalline silicon; and wherein said conductive metal layer comprises aluminum; and wherein said anode of said organic electroluminescence element comprises a transparent conductive material.

22. The light emitting device defined in claim 20, wherein said first refractory metal layer contains either at least one of chromium, molybdenum, tungsten, and titanium, or an alloy including at least one of them; and wherein said conductive metal layer comprises aluminum.

23. The light emitting device defined in claim 22, wherein said active layer comprises a silicon semiconductor; and wherein said anode of said organic electroluminescence element comprises indium tin oxide or indium zinc oxide.

* * * * *